US007619865B2

(12) United States Patent
Thiery et al.

(10) Patent No.: US 7,619,865 B2
(45) Date of Patent: Nov. 17, 2009

(54) ELECTRONIC CIRCUIT PROTECTION DEVICE WITH I²T OR OTHER FUNCTION

(75) Inventors: Vincent Thiery, La Roque d'Antheron (FR); David Jacquinod, La Fare les Oliviers (FR)

(73) Assignee: International Rectifier Corporation, El Segundo, CA (US)

( * ) Notice: Subject to any disclaimer, the term of this patent is extended or adjusted under 35 U.S.C. 154(b) by 504 days.

(21) Appl. No.: 11/193,738

(22) Filed: Jul. 29, 2005

(65) Prior Publication Data
US 2006/0023383 A1 Feb. 2, 2006

Related U.S. Application Data

(60) Provisional application No. 60/598,130, filed on Aug. 2, 2004, provisional application No. 60/624,562, filed on Nov. 3, 2004.

(51) Int. Cl.
*H02H 3/08* (2006.01)
(52) U.S. Cl. ...................................... 361/93.1
(58) Field of Classification Search ................. 361/93.1
See application file for complete search history.

(56) References Cited

U.S. PATENT DOCUMENTS 3,982,115 A * 9/1976 Traa ........................ 708/847
4,782,422 A * 11/1988 Jones et al. .................. 361/87
4,811,136 A * 3/1989 Jones et al. .................. 361/79
4,812,943 A * 3/1989 Jones et al. ................ 361/93.9
5,914,868 A * 6/1999 Han et al. .................... 363/60

(Continued)

FOREIGN PATENT DOCUMENTS

EP 0 600 751 A2 6/1994

(Continued)

OTHER PUBLICATIONS

Japanese Office Action mailed Dec. 11, 2007 in corresponding Japanese Application No. 2005-224615 (with English translation).

*Primary Examiner*—Stephen W Jackson
*Assistant Examiner*—Ann T Hoang
(74) *Attorney, Agent, or Firm*—Farjami & Farjami LLP

(57) ABSTRACT

A circuit protective device includes a current sensing circuit adapted to be coupled to an output power switch to provide a feedback signal representative of the output current, an overcurrent sensor responsive to the feedback signal exceeding a presettable reference level to provide an overcurrent alert signal, a function generator responsive to the feedback signal to generate a first signal related to the output current according to a preset functional relationship, an integration circuit coupled to the output of the function generator to provide a second signal representative of the product of the first signal and t, where t is the elapsed time following generation of an overcurrent alert signal, and a control circuit responsive to a presettable value of the second signal to disable a gating circuit for the power switch, the shut-down signal being provided at a time which depends on the magnitude of the overcurrent signal. The control circuit also shuts down the gating circuit if the output current exceeds a second preset limit representing a short circuit condition with substantially no delay. A related method, and a function generator in the form of a piece-wise linear approximation circuit are also disclosed.

13 Claims, 5 Drawing Sheets

U.S. PATENT DOCUMENTS 6,512,380 B2 * 1/2003 Turvey ................ 324/647

FOREIGN PATENT DOCUMENTS

| JP | S56-001728 | 1/1981 |
| JP | 57031390 A * | 2/1982 |
| JP | S58-224514 | 12/1983 |
| JP | H06-217450 | 8/1994 |
| JP | H09-308078 | 11/1997 |

* cited by examiner

TRUTH TABLE

| OP. CONDITIONS | INPUT | OUTPUT | 1FB PIN VOLTAGE |
|---|---|---|---|
| NORMAL MODE | H | H | 1 LOAD x RFB/RATIO |
| NORMAL MODE | L | L | 0V |
| OPEN LOAD | H | H | 0V |
| OPEN LOAD | L | L | V FAULT |
| SHORT CIRCUIT TO GND | H | L | V FAULT (LATCHED) |
| SHORT CIRCUIT TO GND | L | L | 0V |
| OVER TEMPERATURE | H | L | V FAULT (LATCHED) |
| OVER TEMPERATURE | L | L | 0V |
| SHORT CIRCUIT TO VBAT | H | H | <1 LOAD x RFB/RATIO |
| SHORT CIRCUIT TO VBAT | L | H | 0V |

FIG. 5

ELECTRONIC CIRCUIT PROTECTION DEVICE WITH I²T OR OTHER FUNCTION

CROSS-REFERENCE TO RELATED APPLICATIONS

This application is based on and claims priority to U.S. Provisional Application 60/598,130, filed Aug. 2, 2004, and 60/624,562, filed Nov. 3, 2004, the entire disclosures of which are incorporated herein by reference, as if fully set forth.

BACKGROUND OF THE INVENTION

1. Technical Field of the Invention

The present invention relates to circuit protection devices, and more particularly to electronic circuitry which functions in the manner of a conventional dual element fuse or thermal-magnetic circuit breaker to protect semiconductor power switches and wiring in electrical system for automobiles or other applications. The devices can quickly shut down the drive circuit of a power switch in response to a high fault current, and also to provide a timed shutdown according to an $I^2t$ function or other desired function in response to a lower level overload. The invention is described in the context of an automobile electrical system but those skilled in the art will recognize other semiconductor device applications with which the present invention can advantageously be employed.

2. Relevant Art

Fuses are well known wiring protection devices which provide substantially instantaneous tripping in response to high fault currents, e.g., above about 1000% of rating, or delayed tripping in response to overcurrents up to about 500% to 1000% of rating. So-called dual element fuses and mechanical circuit breakers are also well known devices which can provide both of these functions in a single device. This is advantageous where fast shutdown under short circuit conditions and the timed tripping to accommodate transient inrush currents are both needed. Fuses and circuit breakers can provide these functions acceptably in many instances, but there are applications for which conventional devices are not well suited.

For example, separate fast acting and time delay fuses are customarily used for protection of automotive electrical systems, although dual element fuses, when available for automotive applications.

Headlight circuits and motors are examples of applications requiring a time delay tripping capability. Automotive headlights are exposed to a wide range of temperatures, and when turned on at very low temperatures, can experience quite high transient inrush currents, e.g., ten times the normal operating current at a temperature of −40 C. Motors also generate high inrush (starting) currents.

Even apart from the fact that a supply of different types of fuses must be kept at hand in anticipation of a short circuit or overcurrent condition, replacement of blown fuses in an automobile is generally inconvenient because the fuses are often located out of the way in both the passenger and engine compartments.

Conventional circuit breakers do provide dual protective functions, and can easily be reset, but even the smallest thermal-magnetic circuit breakers, and the panels in which they are designed to be installed, are not small enough for practical use in automotive applications, and would have to be located inconveniently. Of even greater importance would be the cost of circuit breakers.

There exist components with a similar goal, that is provide a protection at a current lower than the inrush current. The philosophy is to set the protection current at a high level for a given time after the power switch is turned on, and to set the protection current at a lower level after this given time. The main drawback of this approach is that the behavior is only related to the time, and not to the energy dissipated. For example, if a light bulb with the switch on, the current protection will be low and the bulb will never turn on because the device will enter protection mode on the inrush current of the light bulb.

Also, for better overcurrent protection, control should be related the energy effectively dissipated.

A need therefore exists for a circuit protective device suitable for protection of switched semiconductor power devices in automotive applications and the like which can provide both instantaneous short circuit protection and time delayed tripping to accommodate transient inrush currents and does not have the disadvantages of conventional devices.

SUMMARY OF THE INVENTION

The present invention meets the above-described need by providing a circuit protective device and a circuit protective method for switched semiconductor power devices intended for use with automotive electrical systems or similar applications which provide timed shut-down when the load current exceeds a first presettable limit representing an overcurrent condition, and instantaneous shut-down when the load current reaches a second presettable limit representing a short circuit condition. The time delay for overcurrent shut-down is determined according to the amount by which the load current exceeds the first limit by generating a signal representing the quantity $I^2t$, where I is the load current, and t is an elapsed time. Alternatively, other functional relationships can be used. In the most general sense, any polynomial in the form $(a+bi+ci^2+di^3)$ it can be used. As a non-limiting example in the description below, the $I^2$ relationship will be employed as a matter of convenience.

According to one aspect of the invention, the circuit protective device includes a current sensing circuit coupled to power switch to provide a feedback signal representative of the output current I, an overcurrent sensor responsive to the feedback signal exceeding a presettable reference level to provide an overcurrent alert signal, a function generator circuit responsive to the output current to generate a first signal representative according to the relationship $I^2$, (or other desired relationship), an integration circuit coupled to the output of the function generator circuit to provide a second signal representative of the first signal and t, where t is the elapsed time following generation of an overcurrent alert signal, and a control circuit responsive to a presettable value of the second signal for providing a shut-down signal to disable a gating circuit for power output switch, the shut-down signal being provided at a time which depends on the magnitude of the overcurrent signal.

Further according to the first aspect of the invention, the first signal function is generated by a piece-wise linear approximation circuit including a calibrated current source and an integration circuit. Also according to the first aspect of the invention, the control circuit is a latching circuit which is designed to disable a drive circuit for a power switch. An additional feature according to the first aspect of the invention is that the control circuit is designed to respond to an output current exceeding a presettable short circuit current reference level to operate the control circuit with no time delay to disable the drive circuit.

In a variation according to the first aspect of the invention, the required functional relationship between the current feedback signal and the control signal can be implemented in other ways. For example, the implementation can be partially or fully digital by converting a current image into a digital word, and the required function generated by an appropriate computation.

According to a second aspect of the invention, the method of protecting an automobile electrical system or the like having a semiconductor output power switch includes coupling a current sensing circuit to the power switch to obtain a feedback signal representative of the current output I of the power supply, comparing the feedback signal to a presettable reference level representing an overcurrent condition, generating a first signal according to a relationship $f(I)^2$ when an overcurrent condition exists, integrating the first signal to provide a second signal representative of the first signal times t, where t is the elapsed time since the beginning of an overcurrent condition, and providing a control signal for disabling the power supply when the second signal exceeds a second presettable reference level, the control signal being provided at a time which depends on the magnitude of the overcurrent signal.

Further according to the second aspect of the invention, the second signal is generated by piece-wise linear approximation or digital computation. Also according to the second aspect of the invention, the control signal operates a latching circuit which is designed to disable a drive circuit for the output power switch. An additional feature according to the second aspect of the invention is that the control signal is generated without time delay when the output current exceeds a presettable short circuit current reference level.

According to a third aspect of the invention, a piecewise linear approximation circuit used to generate the first signal is constructed of a series of current mirror circuits driven in parallel by the feedback signal and connected to the output of the preceding current mirror in the series, a current reference source for each current mirror circuit, and an adder which is coupled to the current mirror circuits and the current reference sources to provide an output according to a piece-wise additive formula.

Further according to the third aspect of the invention, the mirror ratios determine the slope of respective portions of the piece-wise approximation. As a non limiting example, the mirror ratio $R_n$ of the nth current mirror is related to the mirror ratio of the (n–1)th current mirror according to the formula $R_n=2R_{(n-1)}$.

Additionally according to the third aspect of the invention, the current reference levels are selected to determine the respective currents above which slope changes occur.

According to a fourth aspect of the invention, the piece-wise linear approximation circuit can be adapted to generate functions other than square functions in the general form $(a+bi+ci^2+di^3 \ldots)$ Other features and advantages of the present invention will become apparent from the following description of the invention which refers to the accompanying drawings.

BRIEF DESCRIPTION OF THE DRAWING(S)

FIG. 5 is a table showing the functional behavior of the overall device operation.

Throughout the drawings, like parts are designated by the same reference number.

DETAILED DESCRIPTION OF PREFERRED EMBODIMENTS OF THE INVENTION

Figure 1:
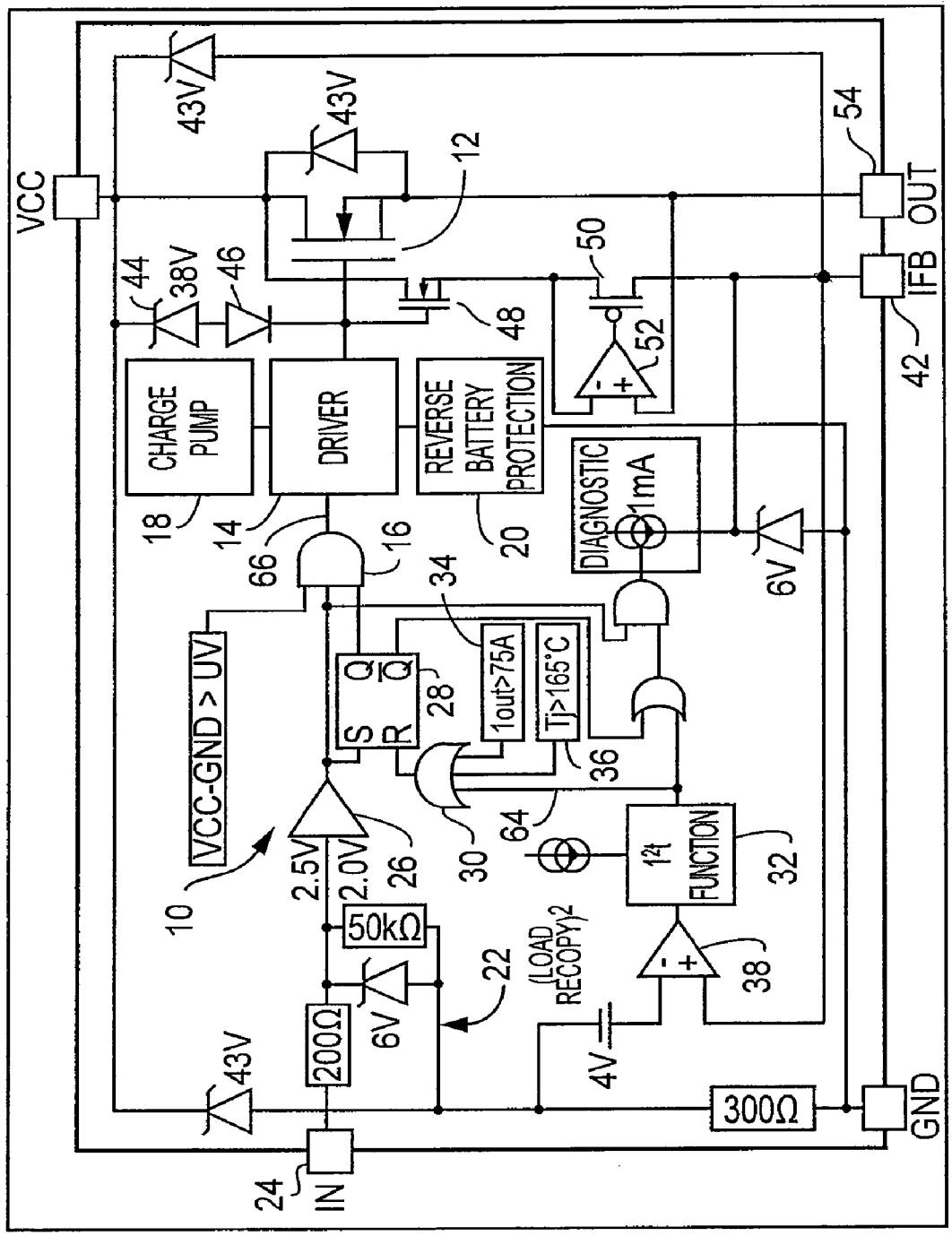
FIG. 1 is an overall block diagram showing an application of the present invention providing protection for an exemplary circuit employing a MOSFET power switch.

Referring now to FIG. 1, the circuit protection device, generally denoted at 10, drives an output switch transistor 12 shown for purposes of illustration as a MOSFET, but which may also be an IGBT, or other power switch. FIG. 1 also illustrates construction of the system as an integrated circuit including MOSFET 12, but the protective circuit and the power switch may be copacked instead. Also, discrete components can be used.

It should further be appreciated that the power circuit can be in the form of a full bridge or a half bridge, with high and low side transistor switches connected in common to an output node 54. In that case, a protective circuit 10 would be associated with each output switch.

Protective device 10 is intended to control the operation of MOSFET 12 through a driver circuit 14 of any conventional or desired construction. A conventional charge pump 18, and a suitable reverse battery protection circuit 20 may also be provided. Driver 14 is coupled to the protection logic circuitry which determines when driver 14 should be disabled.

The protective device circuitry includes an input circuit 22 connected to logic signal input pin 24, a Schmitt trigger circuit 26, a latching flip-flop 28 and an AND gate 16.

Schmitt trigger circuit 26 provides the SET input for latch circuit 28, and also one input for AND date 16. The reset input for latch circuit 28 is provided by an OR gate 30. This receives a first input from an $I^2t$ function generator 32 described in more detail below, which provides a timed overcurrent shutdown signal. The second input is from a current sense output threshold circuit 34 of any suitable type which provides an instantaneous short circuit shutdown signal. The third input is provided by a temperature sensor 36 which provides protection against excessive temperature rises in the device.

The overload shutdown function is implemented by a comparator 38, and the $I^2t$ function generator 32. These are illustrated in further detail in FIGS. 2 and 3. Comparator 38 is fed by a reference voltage source 40 and a current feedback signal at pin 42 (see FIG. 1). The reference voltage source 40 presets a desired threshold level representing an overcurrent condition, and pin 42 provides a feedback signal representing the load current being delivered by power output MOSFET 12. The current feedback signal is generated by a circuit comprised of diodes 44 and 46, transistors 48 and 50 and an OP amp 52 which drives the gate terminal of transistor 50. The positive input for OP amp 52 is provided by output pin 54 and the negative input is provided from the node between transistors 48 and 50.

Figure 2:
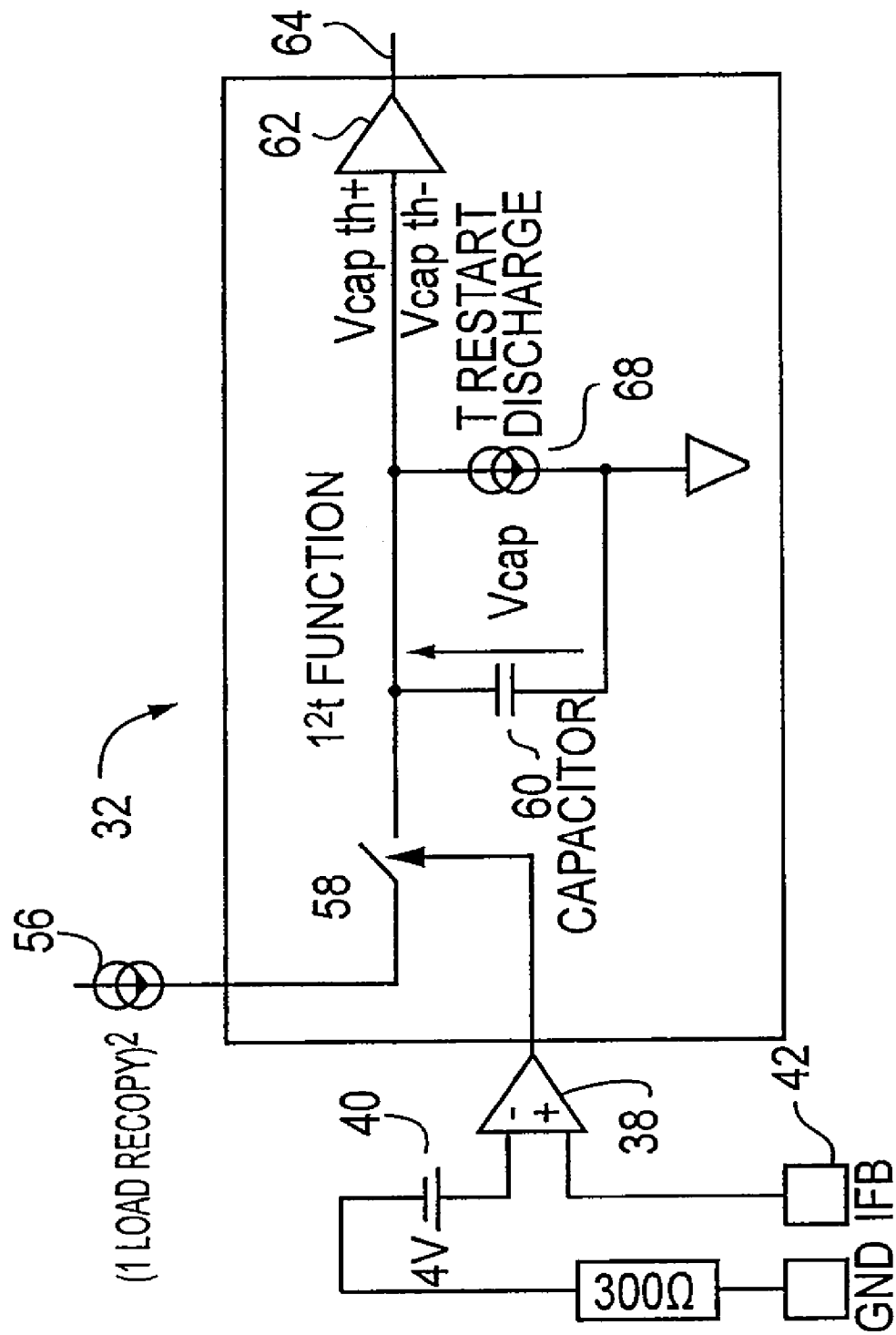
FIG. 2 shows further details of the exemplary $I^2t$ function implementation of FIG. 1.
Figure 3:
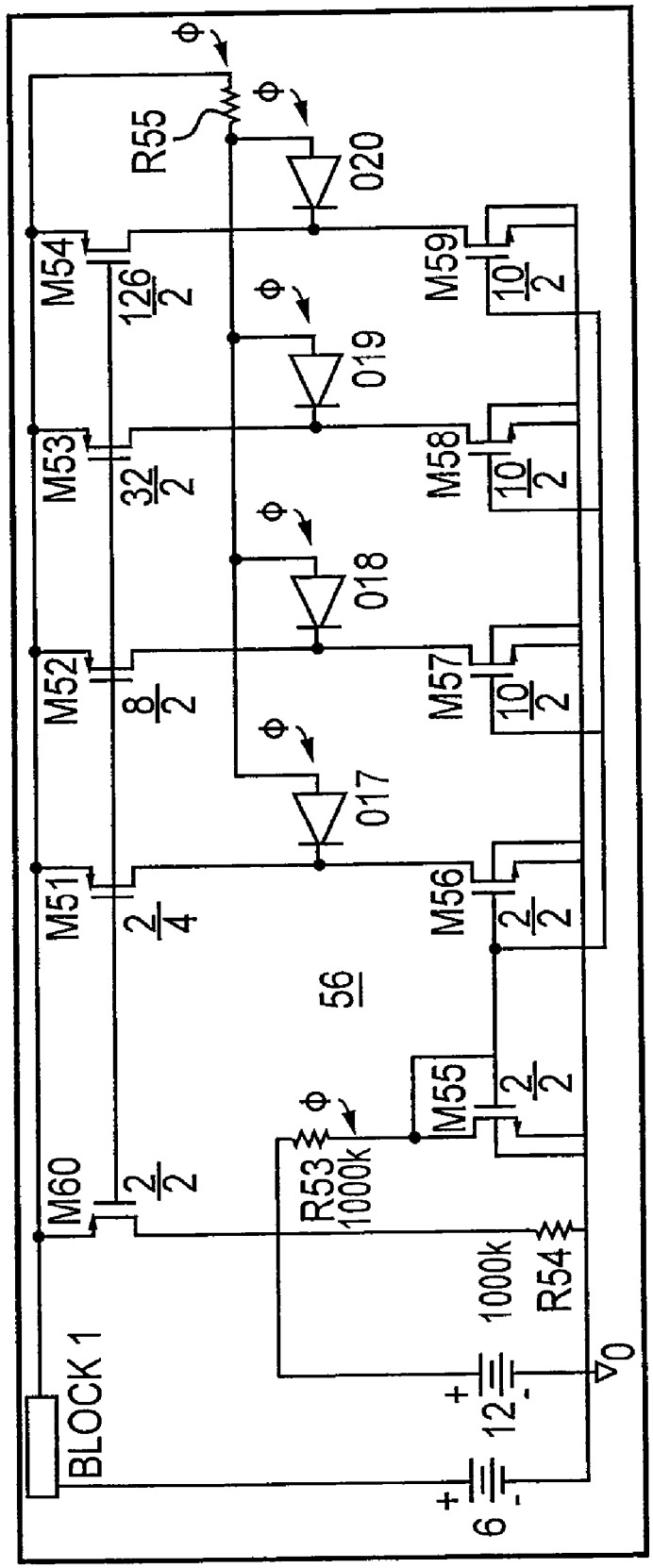
FIG. 3 shows the implementation of a piece-wise linear approximation circuit which provides the $I^2$ signal.

FIG. 2 shows the general construction of a non-limiting exemplary $I^2t$ function generator 32 along with comparator 38 which provides the over current alert signal. The exemplary 12 piece-wise linear approximation circuit itself is illustrated in FIG. 3. Referring to FIG. 2, the $I^2$ signal source is indicated as a current source 56 which is connected through a suitable transistor switch 58 to a capacitor 60 which feeds a Schmitt trigger dual level threshold circuit 62. Voltage source 40 sets a threshold level for comparator 38 representing the nominal rating of the protected wiring and components of the system to provide a control signal for switch 58 whenever the current represented by feedback signal at current feedback pin 42 exceeds the overcurrent limit. When switch 58 closes, capacitor 60 is charged by the I² current signal from source 56 and when it reaches the upper threshold level for circuit 62, an output signal is provided on lead 64 as one input to OR gate 30 to reset latch circuit 28. When that happens, the Q output of latch circuit 28 goes low, the output of AND gate 16 also goes low, and a signal is provided on lead 66 to disable driver 14.

The voltage across capacitor 60 is controlled by a restart discharge current source 68. Capacitor 60 remains sufficiently charged to prevent setting of latching circuit 28 until the voltage at the input of circuit 62 drops below the low threshold value.

To restart driver 14, the signal: at input pin 24 must be recycled to set latch circuit 28 through Schmitt trigger 26. This allows the output of AND gate 16 to reactivate driver 14. However, until capacitor 60 is sufficiently discharged to below the lower threshold of trigger circuit 62, OR gate 30 prevents latch circuit 28 from being set. Thus, once the feedback signal drops below the overcurrent threshold of comparator 38, switch 58 opens, and the current source 68 discharges capacitor 60. The functionality of the circuit as described above is illustrated in the truth table of FIG. 5, the columns of which lists the operating conditions, the signal at input pin 24, the signal at output pin 54, and the voltage at feedback pin 42.

The illustrated construction assures that if a light bulb is replaced, the circuit can not remain latched off. Thus, if a bulb, for example, is replaced with the switch on, the current protection level will be low, but the device can not remain in the protection mode due to the inrush current of the light bulb.

Turning now to FIG. 3, a piece-wise linear approximation circuit 56 comprises four current mirror circuits M56, M57, M58, and M59 and respective associated current reference circuits M51, M52, M53, and M54, connected as illustrated. The signal from current feedback pin 42 is coupled in any suitable manner to provide a current through a resistor R53 which feeds a current mirror circuit M55 having a unity mirror ratio to provide inputs to previously mentioned mirror circuits M56 through M59. The latter are designed to provide optimum mirror ratios suitable for synthesis of a squaring function. Mirror ratios for mirror circuits M56 through M59 are preferably 1X, 2X, 4X, and 8X, respectively. These ratios define the slopes of the piece-wise approximation components.

Current references M51 through M54 provide current signals to mirror circuits M56 through M59 according to current ratios of 1:3:16:64, respectively. These determine the current levels for the mirror circuits at which the slope of the approximation components change.

The total current produced by mirror current circuits M56 through M59 is then summed at resistor R55. Diode circuits D17 through D20 are provided for each of the mirror circuit legs to take account of current difference between a current mirror and the associate current reference.

More particularly, considering leg M56-M51 for example, if the current that M56 tries to inject is lower than the current that M51 tries to inject, the voltage at the cathode of diode D17 is close to VDD supply, so no current flows from this leg through the resistor R55, thanks to the blocking feature of the diode. When the current that M56 tries to inject is higher than the current that M51 tries to inject, the voltage at the cathode of diode D17 is close to GND, so the current from M56 flows through the resistor R55.

In operation, for the mirror ratios and reference current ratios indicated, the signals provided by output summing resistor R55 are indicated by expressions 1 through 4 below:

$$\text{If } IR < IM51{:}IM16 = 0 \quad (1)$$

$$\text{If } IM51 < IR53 < IM52{:}IR55 = (IR53 - IM51) \quad (2)$$

$$\text{If } IM52 < 2 \times IR53 < IM53{:}IR55 = (IR53 - IM51) + (2 \times IR53 - IM52) \quad (3)$$

$$\text{If } IM53 < 4 \times IR53 < IM54{:}IR55 = (IR53 - IM51) + (2 \times IR53 - IM52) + (4 \times IR53 - IM53). \quad (4)$$

Figure 4:
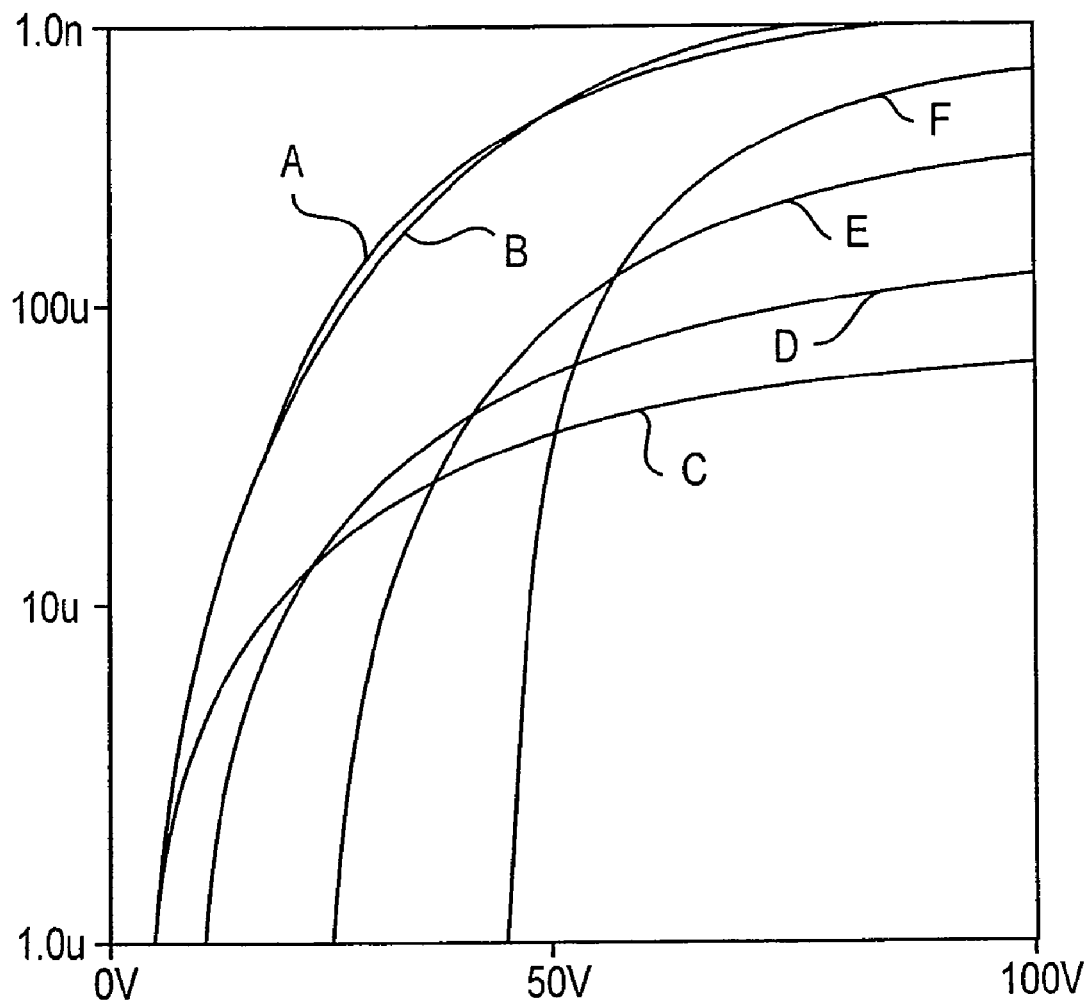
FIG. 4 is a waveform diagram showing the behavior of the circuit illustrated in FIG. 3.

FIG. 4 illustrates the effectiveness of the piece-wise linear approximation provided by circuit 56. Here, a simulation of I² versus an input signal representing the current I is illustrated by waveform A compared to an actual I² function illustrated by waveform B. Waveforms C through F respectively represent the contributions of each stage of the simulation, as provided at respective diodes D 17 through D20. As may be observed, for the mirror ratios and current references optimized as described above, the composite output provides an excellent approximation of a true square function for a wide range of inputs.

The I²t function is quite advantageous since it is directly related to the energy input to the system which in turn, can be related to potential damage due to heat.

The piece-wise linear approximation circuit can alternatively be optimized to approximate other functions such as I³, ln(I), cos(I) . . . , the only limitation being that the slopes of the approximation components do not change directions. This is accomplished in a straight forward manner by calculations or by trial and error simulation.

Although the present invention has been described in relation to particular embodiments thereof, many other variations and modifications and other uses will become apparent to those skilled in the art. It is intended, therefore, that the invention not be limited not by the specific disclosure herein, but that it be given the full scope permitted according to the appended claims.

What is claimed is:

1. A circuit protective device for an electrical system having a semiconductor output power switch, the circuit protective device comprising:
   an electronic current sensing circuit coupled to the power switch to provide a feedback signal representative of the current output I of the power switch;
   a threshold device which is responsive to the feedback signal exceeding a first presettable reference level to provide an overcurrent alert signal;
   a current generator that produces a signal representative of a functional relationship f(I) proportional to I², based on the feedback signal,
   a function generating circuit that receives the overcurrent alert signal as an input and further receives an input from the current generator that generates the signal representative of the functional relationship f(I), the function generating circuit including
      an integration circuit coupled to the output of the current generator to provide a signal representative of the quantity f(I)*t, where t is the elapsed time following generation of the overcurrent alert signal; and
   further comprising a control circuit receiving an output of the integration circuit for providing a shut-down signal to disable the power switch when the output of the integration circuit exceeds a first threshold value,
   wherein the control circuit is operative to enable the power switch to turn back on after it has been turned off by the shutdown signal only when the output of the integration circuit falls below a second threshold value.

2. A circuit protective device according to claim 1, wherein the control circuit is comprised of a latching circuit which is operable to be set in a first state to disable a drive circuit for the power switch, and to be set in a second state to enable the power switch drive circuit.

3. A circuit protective device according to claim 1, wherein the function generating circuit is operative to provide a piece-wise linear approximation of $I^2$ as a function of an input representing the current output I.

4. A circuit protective device according to claim 1, wherein the control circuit is operative in response to an output current exceeding a presettable second short circuit current reference level to disable the control circuit for the power switch with substantially no time delay.

5. A circuit protective device according to claim 1, wherein the functional relationship is the form $f(I)=a+bI^2+cI^3 \ldots$ 6. A circuit protective device for an electrical system having a semiconductor output power switch, the circuit protective device comprising:
   an electronic current sensing circuit coupled to the power switch to provide a feedback signal representative of the current output I of the power switch;
   a threshold device which is responsive to the feedback signal exceeding a first presettable reference level to provide an overcurrent alert signal;
   a function generating circuit responsive to the overcurrent alert signal, receiving an input from a current generator that generates a signal representative of a functional relationship f(I), and operative to provide a piece-wise linear approximation of $I^2$ as a function of an input representing the current output I, the function generating circuit including
   an integration circuit coupled to the output of the current generator to provide a signal representative of the quantity f(I)*t, where t is the elapsed time following generation of the overcurrent alert signal, and
   wherein the function generating circuit comprises a piecewise linear approximation circuit responsive to the current output I for generating an output signal representative of an output variable according to the desired functional relationship f(I), the piecewise linear approximation circuit comprising:
   a plurality of current mirror circuits connected in a series, each characterized by a different mirror ratio, the current mirror circuits being driven in parallel by the current output I and by the output of the preceding current mirror in the series;
   a plurality of current reference sources for the respective current mirror circuits, each current reference source having a different value; and
   an adder circuit coupled to the current mirror circuits and the current reference sources to provide the output signal representing the output variable according to a combination of currents from the plurality of current mirror circuits; and
   the circuit protective device further comprising a control circuit responsive to a threshold value of the output of the integration circuit for providing a shut-down signal to disable the power switch.

7. A circuit protective device according to claim 6, wherein:
   the mirror ratios are selected to determine the slope of a component of a curve representing the output variable versus the input variable; and
   the current reference values are selected to determine the respective values of the input variable above which slope changes occur.

8. A circuit protective device according to claim 7, wherein the mirror ratios and the current references are selected such that the input variable I is related to the output variable according to the functional relationship $f(I)=I^2$.

9. A circuit protective device according to claim 6, wherein the functional relationship is in the form $f(I)=a+bI^2+cI^3 \ldots$ 10. A method of protecting an electrical system having a semiconductor output power switch, including the steps of:
    coupling a current sensing circuit to the power switch to obtain a feedback signal representative of the output current I of the power switch;
    comparing the feedback signal to a presettable reference level representing an overcurrent condition;
    generating a first signal related to the output current I according to a preset functional relationship;
    integrating the first signal to provide a second signal representative of the product of the first signal and t, where t is the elapsed time since the beginning of an overcurrent condition; and
    providing a control signal for disabling a driver circuit for the power switch when the second signal exceeds a second presettable reference level, the control signal being provided at a time which depends on the magnitude of the overcurrent signal; and
    clearing the second signal to enable the power switch only when the second signal is below a further presettable reference level.

11. A method according to claim 10, further including the step of disabling the drive circuit with substantially no time delay when output current I exceeds a second preset level representing a short circuit condition.

12. A method according to claim 10, wherein the functional relationship is in the form $f(I)=I^2$.

13. A method according to claim 10, wherein the functional relationship is in the form $f(I)=a+bI^2+cI^3 \ldots$

* * * * *